(12) United States Patent
Wang

(10) Patent No.: US 6,597,215 B2
(45) Date of Patent: Jul. 22, 2003

(54) POWER DETECTOR FOR DIGITAL INTEGRATED CIRCUITS

(75) Inventor: Kai Wang, Taipei (TW)

(73) Assignee: VIA Technologies Inc., Hsin-Tien (TW)

( * ) Notice: Subject to any disclaimer, the term of this patent is extended or adjusted under 35 U.S.C. 154(b) by 0 days.

(21) Appl. No.: 10/063,138

(22) Filed: Mar. 25, 2002

(65) Prior Publication Data
US 2002/0145455 A1 Oct. 10, 2002

(30) Foreign Application Priority Data

Mar. 28, 2001 (TW) .................................. 90107317 A
Apr. 4, 2001 (TW) .................................. 90108197 A

(51) Int. Cl.⁷ .............................................. H03L 7/00
(52) U.S. Cl. ................................................ 327/143
(58) Field of Search ................................ 327/142, 143, 327/198

(56) References Cited

U.S. PATENT DOCUMENTS 4,885,476 A * 12/1989 Mahabadi .................... 327/143
4,902,907 A * 2/1990 Haga et al. .................. 327/143
5,166,546 A * 11/1992 Savignac et al. ............ 327/143
5,172,012 A * 12/1992 Ueda ........................... 327/143
5,565,811 A * 10/1996 Park et al. ................... 327/546
5,767,711 A * 6/1998 Chevallier et al. .......... 327/143
5,812,001 A * 9/1998 Imamiya ...................... 327/198
5,821,787 A * 10/1998 McClintock et al. ........ 327/143
5,852,376 A * 12/1998 Kraus .......................... 327/143
6,281,738 B1 * 8/2001 Kamiya ........................ 327/513
6,362,669 B1 * 3/2002 Zhou et al. .................. 327/143

* cited by examiner

*Primary Examiner*—Jeffrey Zweizig
(74) *Attorney, Agent, or Firm*—Winston Hsu

(57) ABSTRACT

A power detector on an integrated circuit is described. The integrated circuit has a power supply for supplying a direct current voltage. The power detector has a clamp circuit electrically connected to the power supply for generating a fixed voltage, and a startup circuit electrically connected to the power supply and the clamp circuit for generating a startup signal. When the direct current voltage increases to the fixed voltage, a voltage of an output end of the clamp circuit is increased and fixed at the fixed voltage, and then when the direct current voltage increases to a predetermined voltage, the startup circuit is driven to output the startup signal. Since the power detector can utilize MOS transistors composed of a digital integrated circuit to form its internal elements, the area occupied by the power detector is reduced and the power required by the integrated circuit is decreased.

13 Claims, 5 Drawing Sheets

| | t0 | t1 | t2 | Time |
|---|---|---|---|---|
| Transistor P1,P2 | Closed | Closed | Conducted | Conducted |
| Transistor P3 | Closed | Closed | Closed | Conducted |
| Transistor N1 | Closed | Closed | Closed | Conducted |

Fig. 5

POWER DETECTOR FOR DIGITAL INTEGRATED CIRCUITS

BACKGROUND OF INVENTION

1. Field of the Invention

The invention relates to a power detector on an integrated circuit, and more particularly, to a power detector composed of metal-oxide-semiconductor (MOS) transistors and capable of increasing integration of an integrated circuit.

2. Description of the Prior Art

In modern information society, there has been a spread in the use of microprocessor systems such as informative appliances, computers, or exchange boards as powerful tools for processing a huge amount of information. For convenience of module designs, most of the microprocessor systems have a plurality of integrated circuits. By assembling these integrated circuits appropriately, the function of a microprocessor system can be realized.

Please refer to FIG. 1. FIG. 1 is a function block diagram of a typical integrated circuit 10. The integrated circuit 10 comprises a power supply 12 for supplying a DC bias voltage required by the integrated circuit 10, a core circuit 20, an interface circuit 30, and a power detector 40. The core circuit 20 has a clock generator 22 and a plurality of logic gates 24 for executing a data processing function of the core circuit 20. The power supply 12 includes a first output end 14 and a second output end 16. The first output end 14 is electrically connected to the power detector 40 and the core circuit 20, and the second output end 16 is electrically connected to the interface circuit 30 and the power detector 40. The power supply 12 acquires power from the exterior of the integrated circuit 10 and then supplies a DC core voltage through the first output end 14 and a DC interface voltage through the second output end 16 so as to satisfy the power requirements of the integrated circuit 10.

Furthermore, the core circuit 20 is used to execute various functions of the integrated circuit 10, such as data operations and processes. The interface circuit 30 is responsible for tasks such as exchanges of data between the integrated circuit 10 and other external integrated circuits. That is, the interface circuit 30 receives data from the external integrated circuits and transmits the data to the core circuit 20 for processing. Thereafter, the data that has been processed by the core circuit 20 is transmitted to the external integrated circuits through the interface circuit 30.

For decreasing power consumption so as to help realize high integration and high-speed operations of the integrated circuit 10, the DC core voltage utilized by the core circuit 20 is lower. On the other hand, the interface circuit 30 uses a higher DC interface voltage so as to achieve a better driving ability and a better noise margin. That is why the power supply 12 has to have two output ends, i.e., the first output end 14 and the second output end 16, to supply the DC core voltage with a lower value to the core circuit 20 and the DC interface voltage with a higher value to the interface circuit 30, respectively. Taking a chip composed of various integrated circuits on a motherboard of a computer such as a random access memory (RAM), a central processing unit (CPU), or a north bridge chip responsible for the communications between the RAM and the CPU as an example, the DC interface voltage used for exchanging data between each of the integrated circuits via buses is 3.3V, and the DC core voltage used for internal operations in each of the integrated circuits is 2.5V.

When a microprocessor system is turned on, the power supply 12 of the integrated circuit 10 acquires power from the exterior of the integrated circuit 10. The power supply 12 starts to set up the DC core voltage with a lower value and supply the DC core voltage to the core circuit 20, then the power supply 12 sets up the DC interface voltage with a higher value and supplies the DC interface voltage to the interface circuit 30. In the period of time that the power supply 20 supplies the DC core voltage but has not yet set up the stable DC interface voltage if the core circuit 20 has received the DC core voltage and starts to work, the core circuit 20 cannot execute tasks normally since the DC interface voltage required by the interface circuit 30 has not been set up.

For ensuring the core circuit 20 and the interface circuit 30 of the integrated circuit 10 can be operated simultaneously, the integrated circuit 10 further comprises a power detector 40 for detecting whether the power supply 12 has set up the stable two DC voltage. Only when the power supply 12 has set up the stable DC interface voltage, the interface circuit 30 can execute tasks appropriately and then the core circuit 20 can thus be activated at this time. That is, if the power supply 12 has not set up the DC interface voltage, the power detector 40 cannot trigger the core circuit 20 to work. Conversely, if the power detector 40 detects that the power supply 12 has set up the stable DC interface voltage, the power detector 40 will input a reset signal to the core circuit 20 to inform the core circuit 20 to be ready for startup so as to cooperate with the interface circuit 30. After receiving the reset signal from the power detector 40, the core circuit 20 resets the logic gates 24 in the core circuit 20 for resetting the statuses of each of the logic gates 24. Meanwhile, the clock generator 22 of the core circuit 20 is activated to generate clocks. Then, the integrated circuit 10 can be operated according to the clocks.

Please refer to FIG. 2. FIG. 2 is a function block diagram illustrating the prior art power detector 40 used with the power supply 12 and the core circuit 20 in the integrated circuit 10. The prior art power detector 40 comprises a comparator 44 and a voltage stabilizer 42. The comparator 44 has two comparison ends 46 and 48. The comparison end 46 is electrically connected to the power supply 12 for receiving the DC interface voltage from the second output end 16 of the power supply 12, and the comparison end 48 is electrically connected to an output end of the voltage stabilizer 42. Furthermore, an output end of the comparator 44 is electrically connected to the core circuit 20 for outputting the reset signal. The voltage stabilizer 42 in the power detector 40 utilizes the DC core voltage from the first output end 14 of the power supply 12 to generate a reference voltage Vref used for comparison and then outputted to the comparison end 48 of the comparator 44.

When the power supply 12 starts to set up the DC interface voltage, a voltage of the second output end 16 of the power supply 12 is increased from the magnitude of zero and the comparator 44 compares the voltage of the second output end 16 with the reference voltage Vref. If the voltage of the second output end 16 does not exceed the reference voltage Vref, the comparator 44 outputs a low level signal to the core circuit 20 and does not trigger the core circuit 20. When the voltage of the second output end 16 is increased to exceed the reference voltage Vref, then the power supply 12 can set up the stable DC interface voltage. Meanwhile, the comparator 44 outputs the high-level reset signal to the core circuit 20 and then the reset signal triggers the core circuit 20.

Furthermore, the voltage stabilizer 42 of the prior art power detector 40 is at least composed of a band-gap circuit. The band-gap circuit has to drive its internal feedback mechanism via current so as to set up the reference voltage Vref. Thus, the voltage stabilizer 42, i.e., the band-gap circuit is mainly composed of bipolar junction transistors (BJTs), just like the prior art disclosed in U.S. Pat. No. 5,619,163. Therefore, the voltage stabilizer 42 formed on the integrated circuit 10 occupies a lot of area, leading to the integration of the whole integrated circuit 10 being adversely affected. Moreover, since the band-gap circuit is power consumptive, the power required by the whole integrated circuit 10 is substantially increased. Meanwhile, the greater power consumption of the band-gap circuit generates a huge amount of waste heat. For these reasons, the volume of the microprocessor cannot be reduced.

Additionally, as previously described, the reference voltage Vref has to be set up before the voltage of the second output end 16 starts to increase from the magnitude of zero, or the voltage of the second output end 16 has no standard for comparison. For reducing the set up time of the voltage stabilizer 42, the voltage stabilizer 42 has to further include an accelerated circuit. The accelerated circuit thus further increases the power consumption of the prior art power detector 40. Additionally, since the comparator 44 of the prior art power detector 40 needs more than ten transistors to function, the area of the prior art power detector 40 cannot be reduced.

SUMMARY OF INVENTION

It is therefore a primary objective of the claimed invention to provide a power detector on an integrated circuit to solve the above-mentioned problem.

According to the claimed invention, a power detector on an integrated circuit is disclosed. The integrated circuit has a power supply for supplying a direct current voltage. The power detector comprises a clamp circuit electrically connected to the power supply for generating a fixed voltage, and a startup circuit electrically connected to the power supply and the clamp circuit for generating a startup signal. When the direct current voltage outputted from the power supply increases to the level of the fixed voltage, a voltage of an output end of the clamp circuit is increased and fixed at the fixed voltage. Then, when the direct current voltage outputted from the power supply increases to a predetermined voltage, the startup circuit is driven to output the startup signal.

It is an advantage of the claimed invention that the power detector on the integrated circuit is capable of utilizing standard metal-oxide-semiconductor (MOS) transistors composed of a digital circuit to form its internal elements. Consequently, the space occupied by the power detector is substantially reduced and the power required by the integrated circuit is significantly decreased as well.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 5 is a schematic diagram of status variations in each transistor of the power detector with time according to the present invention.

DETAILED DESCRIPTION

Figure 1:
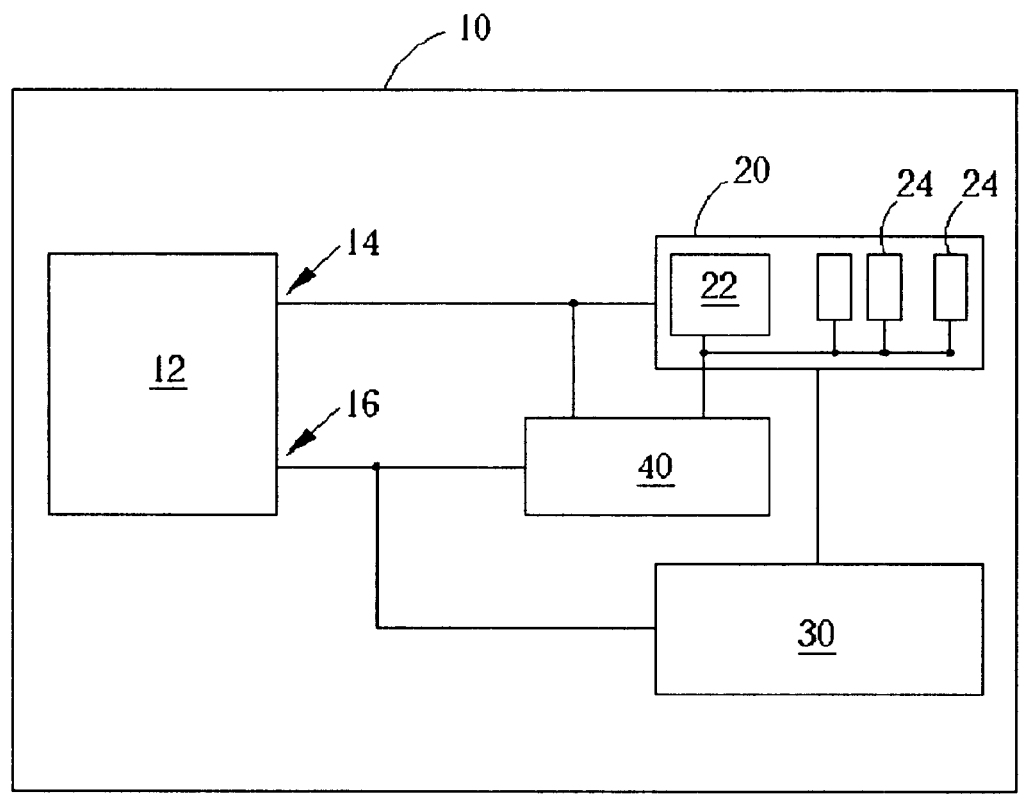
FIG. 1 is a function block diagram of a typical integrated circuit.
Figure 2:
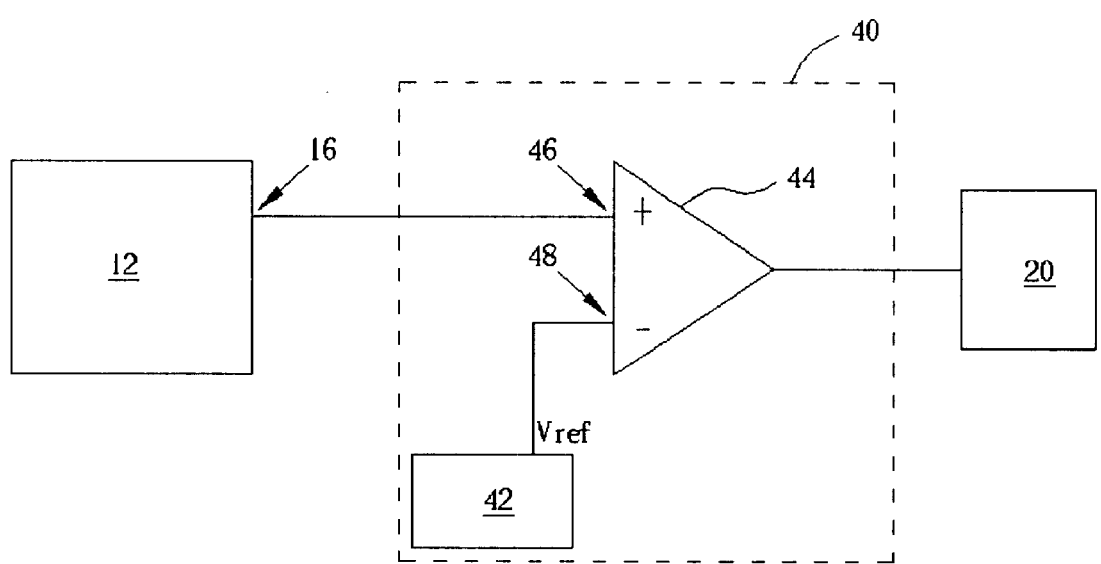
FIG. 2 is a function block diagram illustrating a power detector shown in FIG. 1.
Figure 3:
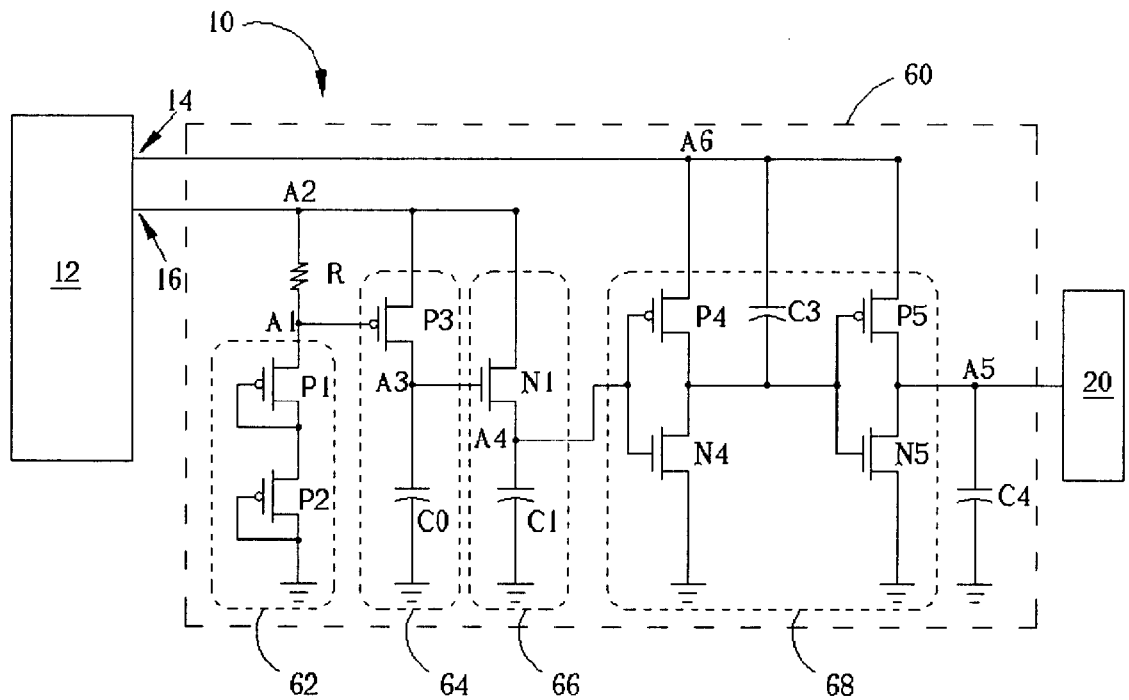
FIG. 3 is a circuit diagram of a power detector according to the present invention.

Please refer to FIG. 3. FIG. 3 is a circuit diagram of a power detector 60 utilized in the integrated circuit 10 shown in FIG. 1 according to the present invention. The power detector 60 of the present invention comprises a clamp circuit 62, a startup circuit 64, a waveform corrector 66, and a reset signal generator 68. As previously described, the first output end 14 of the power supply 12 is used to output a DC core voltage and the second output end 16 of the power supply 12 is used to generate a DC interface voltage. The clamp circuit 62 is electrically connected to the second output end 16 of the power supply 12 at node A2 by passing through a resistor R. The startup circuit 64 and the waveform corrector 66 are also electrically connected to the second output end 16 of the power supply 12. Additionally, the waveform corrector 66 is electrically connected to the reset signal generator 68 at node A4. Meanwhile, the reset signal generator 68 is electrically connected to the core circuit 20 at node A5 and is electrically connected to the first output end 14 of the power supply 12 at node A6. Moreover, the reset signal generator 68 can supply a voltage that is equal to the DC core voltage supplied from the first output end 14 of the power supply 12.

In the power detector 60 of the present invention, the clamp circuit 62 comprises two P-type metal-oxide-semiconductor (MOS) transistors P1 and P2, and each gate of the transistors is electrically connected to respective drains of the transistors so that the transistors P1 and P2 can form two diodes connected in series. Furthermore, the startup circuit 64 has a P-type MOS transistor P3 used as a switch. The waveform corrector 66 includes a N-type MOS transistor N1. The reset signal generator 68 comprises two P-type MOS transistors P4 and P5 and two N-type MOS transistors N4 and N5. The transistors P4 and N4 are electrically connected to each other so as to form a complementary metal-oxide-semiconductor (CMOS) used as an inverter. Likewise, the transistors P5 and N5 also form an inverter. The power detector 60 further has capacitors C0, C1, C3, and C4 capable of absorbing glitches generated from sudden changes in statuses of each transistor.

Figure 4:
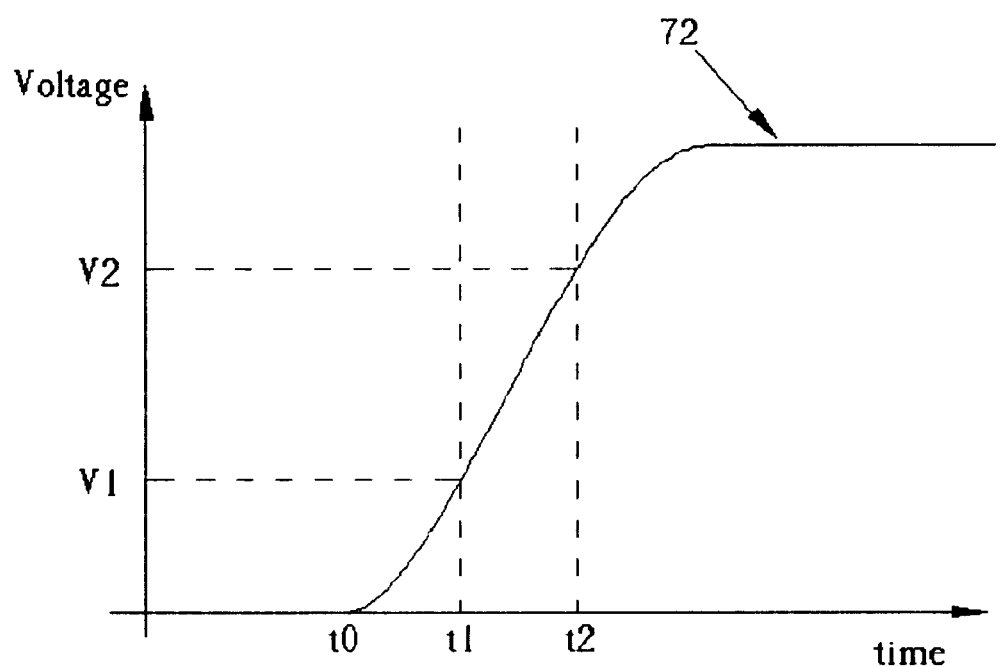
FIG. 4 is a correlation diagram illustrating variations in the DC interface voltage from the second output end of the power supply with time according to the present invention.

Please refer to FIGS. 4 and 5. FIG. 4 is a correlation diagram illustrating waveform variations in the DC interface voltage from the second output end 16 of the power supply 12 with time. FIG. 5 is a schematic diagram of status variations in each transistor of the power detector 60 with time according to the present invention. In FIG. 4, the vertical axis is voltage and the horizontal axis is time. In FIG. 5, the horizontal axis is time as well, and the statuses of the transistors P1, P2, P3, and N1 at different time periods are shown. A waveform 72 shown in FIG. 4 is a waveform illustrating the increase of the voltage of the second output end 16 of the power supply 12 with time. When the power supply 12 starts to set up the DC interface voltage of the second output end 16 at time t0, the voltage of the second output end 16 is increased with time as the waveform 72 shows. Surely, before time t0, the transistors P1, P2 in the clamp circuit 62, transistor P3 in the startup circuit 64, and transistor N1 in the waveform corrector 66 are all closed, i.e., are not conducting since the voltage of the second output end 16 is zero. Meanwhile, since there is no current flowing between nodes A1 and A2 as shown in FIG. 3, the voltage of node A1 is equal to the voltage of node A2.

As time goes on, the voltage of the second output end 16 is increased and reaches the magnitude of V1 at time t1.

Since the voltage V1 is approximately equal to a sum of absolute values of threshold voltages of the two transistors P1 and P2, the transistors P1 and P2 in the clamp circuit 62 are conducted when the voltage of the second output end 16 exceeds V1 after time t1. Once the transistors P1 and P2 are conducting, there is a current flowing between nodes A1 and A2. Meanwhile, since the two transistors P1 and P2 are functioning as diodes, a crossing voltage between a source and a drain of the transistor P1 or P2 is not significantly increased with the current flowing through the transistors P1 and P2. That is, the voltage of node A1 is equivalently clamped at the voltage V1, then the voltage V1 is a fixed voltage supplied by the clamp circuit 62.

After time t1, when the current has flowed through the resistor R, a voltage difference is generated between nodes A1 and A2. Then, the voltage of node A2 starts to be higher than the voltage of node A1. As the voltage of the second output end 16 increases after time t1, the voltage of node A2 also increases. Since the voltage of node A1 is clamped at the fixed voltage by the clamp circuit 62, the voltage difference between nodes A2 and A1 is increased according to the voltage of node A2, i.e., the voltage of the second output end 16.

At time t2, the voltage of the second output end 16 is increased to the magnitude of V2, and the voltage difference between nodes A1 and A2 starts to exceed a value of the voltage V2 minus the voltage V1. Thus, the transistor P3 in the startup circuit 64 starts to be conducted. After the transistor P3 has been conducted, a voltage of node A3 is increased rapidly from the magnitude of zero to the approximate magnitude of the voltage of node A2. Consequently, a waveform illustrating a variation of the voltage of node A3 with time becomes a step waveform, and node A3 in the startup circuit 64 is capable of transmitting a high-level startup signal.

Additionally, the increase of the voltage of node A3 also drives the transistor N1 in the waveform corrector 66 to be conducted. Simultaneously, a voltage of node A4 is rapidly increased from the magnitude of zero with the conduction of the transistor N1. Since the N-type MOS transistor N1 has a better current driving ability, the voltage of node A4 has a rising rate higher than a rising rate of the voltage of node A3. Thus, a waveform illustrating a variation of the voltage of node A4 with time is much closer to a standard step signal than the waveform of node A3. That is, a slope of a rising edge of the waveform of node A4 is greater than a slope of a rising edge of the waveform of node A3. Equivalently, the startup signal transmitted by node A3 in the startup circuit 64 is corrected by the waveform corrector 66 so as to form the standard step signal. Then, the corrected startup signal is outputted from node A4 of the waveform corrector 66 to the reset signal generator 68. Incidentally, the rapid rise of the startup signal from a low level to a high level can significantly decrease the power consumption.

After the reset signal generator 68 has received the corrected startup signal from node A4, the corrected startup signal is inverted twice sequentially through the two inverters composed of the transistors P4, N4 and P5, N5 in the reset signal generator 68. Then, a digital reset signal is outputted from node A5 to the core circuit 20. The transistors P4, N4, P5, and N5 in the reset signal generator 68 may have a same structure of transistors in the core circuit 20. Thus, the reset signal outputted from node A5 becomes an acceptable standard digital signal of the core circuit 20. That is, the reset signal is the standard digital signal which is changed from a digital "0" to a digital "1".

Additionally, since the transistors P4, N4 and P5, N5 in the reset signal generator 68 form two CMOS transistors respectively, power is consumed only when a status of a transistor changes. For example, a process of a low-level status of a transistor changing into a high-level status will consume power. That is why the startup signal, which triggers the reset signal generator 68, has to be corrected into the proper step signal by the waveform corrector 66. Nevertheless, overall power consumption of the power detector 60 according to the present invention can be substantially reduced.

In summary, when the DC interface voltage outputted from the second output end 16 of the power supply 12 is increased from the magnitude of zero to the fixed voltage V1 at time t1, the voltage of the clamp circuit 62 in the power detector 60 is the fixed voltage V1. Then, after time t2, when the voltage outputted from the second output end 16 exceeds the voltage V2, the transistor P3 in the startup circuit 64 is rapidly conducted and then triggers the transistor N1 in the waveform corrector 66 to be conducted as well. Finally, the reset signal generator 68 transmits a digital reset signal changing from a digital "0" to a digital "1" to the core circuit 20.

Comparing with the power supply 12, which has to spend time on the order of a microsecond to set up a stable DC interface voltage, the above-mentioned process of generating the reset signal has a shorter period than a microsecond. That is, the power detector 60 of the present invention can be triggered to transmit the digital reset signal to the core circuit 20 at an instant when the voltage of the second output end 16 exceeds the voltage V2. Thus, the voltage V2 becomes acriterion when judging whether the second output end 16 of the power supply 12 has set up a stable DC interface voltage. Incidentally, the magnitude of the voltage V2 is determined by the resistance of the resistor R and the characteristics of the transistors P1 and P2 in the clamp circuit 62, such as an aspect ratio (W/L) of the transistor P1 or P2. Therefore, the voltage V2 is a predetermined voltage, which has been set during design of the power detector 60 of the present invention. Hence, once the voltage of the second output end 16 exceeds the predetermined voltage V2, the power detector 60 presumes that the power supply 12 has set up a stable DC interface voltage at the second output end 16. Thus, the stable DC interface voltage is supplied to the interface circuit 30 for activation and normal operation. Meanwhile, the power detector 60 utilizes the digital reset signal to trigger the core circuit 20 so that the core circuit 20 can start to cooperate with the interface circuit 30 so as to execute the function of the integrated circuit 10.

In contrast to the prior art power detector 40, the power detector 60 according to the present invention does not require the complicated voltage stabilizer and comparator, which are composed of more than ten transistors. The power detector 60 can merely comprise several transistors to realize the circuit architecture of the power detector 60 according to the present invention. Thus, the area of the power detector 60 can be substantially reduced and the number of the required transistors can also be significantly decreased. Hence, the power detector 60 consumes less power than the prior art power detector 40. Additionally, the waveform corrector 66 in the power detector 60 of the present invention can further reduce the power consumption. Consequently, the power detector 60 according to the present invention is no doubt superior to the prior art power detector 40.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A power detector on an integrated circuit, the integrated circuit having a power supply for supplying a direct current voltage, the power detector comprising:

a clamp circuit electrically connected to the power supply for generating a fixed voltage;

a startup circuit electrically connected to the power supply and the clamp circuit for generating a startup signal; and a reset signal generator electrically connected to a waveform corrector for outputting a digital reset signal after receiving the startup signal, the reset signal generator comprising two inverters connected in series for generating the digital reset signal;

wherein when direct current voltage outputted from the power supply increases to the fixed voltage, a voltage of an output end of the clamp circuit is increased and fixed at the fixed voltage, and then when the direct current voltage outputted from the power supply increases to a predetermined voltage, the startup circuit is driven to output the startup signal.

2. The power detector of claim 1 wherein the clamp circuit comprises at least one transistor, a gate of the transistor is connected to a drain of the transistor, and when the direct current voltage outputted from the power supply is increased to the fixed voltage, the transistor is conducted and outputs the fixed voltage.

3. The power detector of claim 1 wherein the waveform corrector is electrically connected to the power supply and the startup circuit for correcting a waveform of the startup signal generated by the startup circuit.

4. The power detector of claim 3 wherein the reset signal generator is electrically connected to the waveform corrector for outputting a digital reset signal after receiving the corrected startup signal.

5. The power detector of claim 1 wherein the power detector is installed on a north bridge chip of a motherboard.

6. The power detector of claim 1 wherein the integrated circuit further comprises a plurality of logic gates capable of being reset by the digital reset signal.

7. The power detector of claim 1 wherein the integrated circuit further comprises a timer electrically connected to the reset signal generator, and when the timer receives the digital reset signal, the timer generates a pulse for controlling operations of the integrated circuit.

8. A power detector on an integrated circuit, the integrated circuit having a power supply for supplying a direct current voltage, the power detector comprising:

a clamp circuit electrically connected to the power supply for generating a fixed voltage;

a startup circuit electrically connected to the power supply and the clamp circuit for generating a startup signal;

a waveform corrector electrically connected to the power supply and the startup circuit for correcting a waveform of the startup signal; and a reset signal generator electrically connected to the waveform corrector for outputting a digital reset signal after receiving the corrected startup signal, the reset signal generator comprising two inverters connected in series for generating the digital reset signal;

wherein when the direct current voltage outputted from the power supply increases to the fixed voltage, a voltage of an output end of the clamp circuit is increased and fixed at the fixed voltage, and then when the direct current voltage outputted from the power supply increases to a predetermined voltage, the startup circuit is driven to output the startup signal, thereafter, when the startup signal has been corrected by the waveform corrector, the reset signal generator outputs the digital reset signal.

9. The power detector of claim 8 wherein the clamp circuit comprises at least one transistor, a gate of the transistor is connected to a drain of the transistor, and when the direct current voltage outputted from the power supply is increased to the fixed voltage, the transistor is conducted and outputs the fixed voltage.

10. The power detector of claim 8 wherein the power detector is installed on a north bridge chip of a motherboard.

11. The power detector of claim 8 wherein the integrated circuit further comprises a plurality of logic gates capable of being reset by the digital reset signal.

12. The power detector of claim 8 wherein the integrated circuit further comprises a timer electrically connected to the reset signal generator, and when the timer receives the digital reset signal, the timer generates a pulse for controlling operations of the integrated circuit.

13. A power detector on an integrated circuit, the integrated circuit having a power supply to supplying a direct current voltage, the power detector comprising:

a clamp circuit electrically connected to the power supply for generating a fixed voltage;

a startup circuit electrically connected to the power supply and the clamp circuit for generating a startup signal;

a reset signal generator electrically connected to a waveform corrector for outputting a digital reset signal after receiving the startup signal; and a timer comprised by the integrated circuit and electrically connected to the reset signal generator such that when the timer receives the digital reset signal, the timer generates a pulse for controlling operations of the integrated circuit;

wherein when the direct current voltage outputted from the power supply increases to the fixed voltage, a voltage of an output end of the clamp circuit is increased and fixed at the fixed voltage, and then when the direct current voltage outputted from the power supply increases to a predetermined voltage, the startup circuit is driven to output the startup signal.

* * * * *